United States Patent [19]
Fukuda et al.

[11] Patent Number: 6,150,183
[45] Date of Patent: *Nov. 21, 2000

[54] METHOD FOR MANUFACTURING METAL OXIDE CAPACITOR AND METHOD FOR MANUFACTURING SEMICONDUCTOR MEMORY DEVICE

[75] Inventors: Yukio Fukuda, Tohkai-mura; Katsuhiro Aoki; Akitoshi Nishimura, both of Tsuchiura, all of Japan; Ken Numata, Dallas, Tex.

[73] Assignee: Texas Instruments Incorporated, Dallas, Tex.

[*] Notice: This patent issued on a continued prosecution application filed under 37 CFR 1.53(d), and is subject to the twenty year patent term provisions of 35 U.S.C. 154(a)(2).

[21] Appl. No.: 08/993,873

[22] Filed: Dec. 18, 1997

[30] Foreign Application Priority Data

Dec. 20, 1996 [JP] Japan ................................. 8-355139

[51] Int. Cl.$^7$ ........................................................ H01G 7/06
[52] U.S. Cl. ................................................ 438/3; 438/240
[58] Field of Search ................................. 438/238–240, 438/381–399, 3

[56] References Cited

U.S. PATENT DOCUMENTS

5,443,030   8/1995   Ishihara et al. .............................. 117/8

*Primary Examiner*—Jey Tsai
*Attorney, Agent, or Firm*—Bret J. Petersen; Frederick J. Telecky, Jr.

[57] ABSTRACT

A metal oxide capacitor is manufactured by sequentially laminating a metal oxide film and a secon electrode on a first electrode. The metal oxide film is formed and then heat-treated in an atmosphere with an oxygen pressure higher than 1 atm.

14 Claims, 8 Drawing Sheets

METHOD FOR MANUFACTURING METAL OXIDE CAPACITOR AND METHOD FOR MANUFACTURING SEMICONDUCTOR MEMORY DEVICE

FIELD OF THE INVENTION

The present invention pertains to a method for manufacturing a metal oxide capacitor (in particular, high-dielectric capacitor such as (Ba, Sr)TiO$_3$ or ferroelectric capacitor such as Pb(Zr, Ti)O$_3$) and a method for manufacturing a semiconductor memory device having the metal oxide capacitor.

BACKGROUND OF THE INVENTION

As a conventional capacitor dielectric film for forming a cell capacity of a memory cell of a DRAM (Dynamic Random Access Memory) as a semiconductor memory, an ONO film in which SiO$_2$, Si$_3$N$_4$, and SiO$_2$ are sequentially laminated is used. However, the effective relative dielectric constant of the ONO film is as small as about 5, and in case it is applied to a large-capacity memory of 256 Mbit or less, the process is considerably difficult.

On the contrary, since an insulating metal oxide represented by Ta$_2$O$_5$, (Ba, Sr)TiO$_3$ (hereinafter, abbreviated to BST), and Pb(Zr, Ti)O$_3$ (hereinafter, abbreviated to PZT) has a large relative dielectric constant from several tens to several hundreds, a capacitor dielectric material for a future DRAM is noticed.

Next, as an example, a case where the metal oxide thin-film capacitor is formed using BST as a metal oxide is mentioned, and the problems of the prior art are mentioned.

Figure 16:
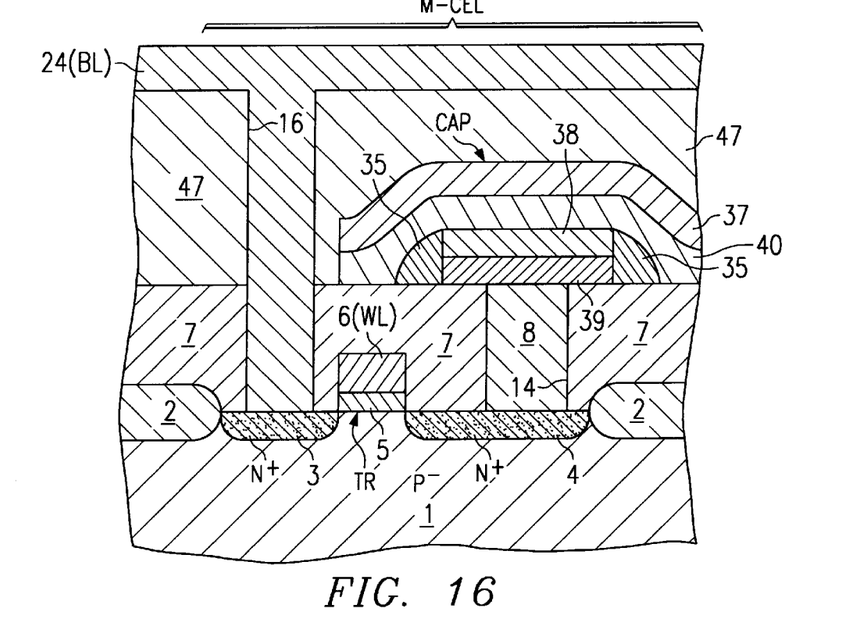
FIG. 16 is an outlined cross section of a conventional memory cell having a capacitor with a Pt/BST/Pt structure.

In a conventional high-dielectric capacitor Cap shown in FIG. 16*, a lower electrode 38 (using a noble metal such as Pt, Ir, and Ru in terms of oxidation resistance) is laminated on a barrier metal layer 39 (using a nitride such as TiN and TaN in terms of oxidation resistance) for preventing the diffusion of an electrode-constituting component, and a BST high-dielectric thin-film 40 is formed on the lower electrode 38 by sputtering method, chemical vapor deposition method (CVD), or sol-gel method. Furthermore, an upper electrode 37 (using a noble metal such as Pt, Ir, and Ru similarly to the lower electrode 38) is formed in almost the same pattern as the above.

Then, on the side surface of the barrier metal layer 39 and the lower electrode 38, a spacer (side wall for securing insulation) 35 composed of a silicon oxide film is formed. Also, the lower electrode 38 is connected to a silicon substrate side via a metal layer (plug) 8 such as polysilicon as a storage node embedded in a contact hole 14 of an insulating film 7 such as SiO$_2$.

A memory cell of the DRAM having the high-dielectric capacitor is explained. For example, an element area divided by a field oxide film 2 is formed on one principal plane of a P⁻ silicon substrate, and a transfer gate TR consisting of a MOS transistor and a memory cell M-Cel consisting of the high-dielectric capacitor Cap are installed in it. The memory cell is a CUB (Cell under Bitline) type.

In the transfer gate TR, for example, N$^+$ drain region 3 and N$^+$ source region 4 are respectively formed by an impurity diffusion, and a word line 6 (WL) is installed via a gate oxide film 5 between these two regions. A bit line 24 (BL) is connected via a contact hole 16 of insulating layers 7 and 47 such as SiO$_2$ to the drain region 3.

In FIG. 16, a thin BST film 40 is formed by CVD method, sputtering method, sol-gel method, etc.; however, its formation is carried out in an oxygen atmosphere. Furthermore, after forming a capacitor, a heat treatment (hereinafter, called a postannealing) [is carried out] in an oxygen atmosphere of 1 atm to improve its leakage current characteristic and dielectric characteristic.

Figure 17:
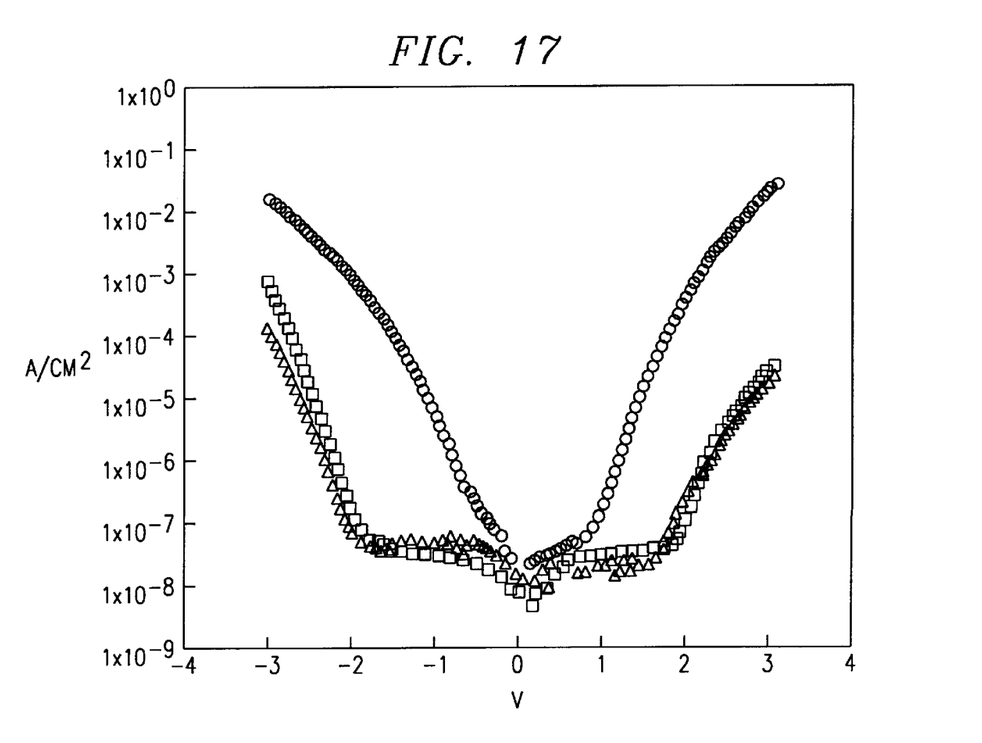
FIG. 17 is a characteristic diagram showing a comparison of the current-voltage characteristic after applying a postannealing at different temperatures to the same capacitor.

As for the postannealing, FIG. 17 shows a relationship between the current-voltage characteristic and the postannealing temperature (500° C., 700° C.) of a BST capacitor, in which the BST film 40 is formed at a film thickness of 25 nm on the Pt lower electrode 38 at a substrate temperature of 550° C. by a sputtering method. Here, the upper electrode is Pt, and the postannealing time is 30 min.

As seen from FIG. 17, compared with nonpostannealing (as-deposited), the leakage current characteristic after postannealing is largely improved. Also, the higher the postannealing temperature, the smaller the leakage current density.

Thus, the leakage current characteristic of the capacitor is markedly improved by postannealing, and as the treatment temperature increases, a large effect is obtained.

However, since the above-mentioned postannealing is carried out in an oxygen atmosphere, a barrier metal 39 of FIG. 16 is oxidized in the meantime, so that TiO$_2$, for instance, is formed. The reason for this is considered that an oxygen atom diffuses up to the interface with the barrier metal 39 through a grain boundary of the lower electrode 38 and the barrier metal is oxidized. If the postannealing [temperature] is increased, such a phenomenon is accelerated. Also, it is considered that if the grain size of the lower electrode 38 is small, the oxygen is easily diffused. The oxygen diffusion can be suppressed by increasing the grain size to 1000 Å or more, for instance, by raising the formation temperature of the lower electrode (furthermore, the leakage current is also reduced); however, if the grain size is increased, if the patterning due to a dry etching is difficult, the lower electrode is usually formed so that the grain size can be about 500 Å from this viewpoint. Thus, the suppression effect of the oxygen diffusion is weakened.

Accordingly, if the nitride such as TiN and TaN as a barrier metal is oxidized, since it is changed to an insulating oxide, an inferior electrification between the plug 8 and the lower electrode 38 is caused. Therefore, it is necessary to set the postannealing temperature sufficiently lower than the oxidation temperature of the nitride such as TiN and TaN. This is a condition contradictory to the leakage current reduction effect shown in FIG. 17 due to the increase of the postannealing temperature.

Figure 18:
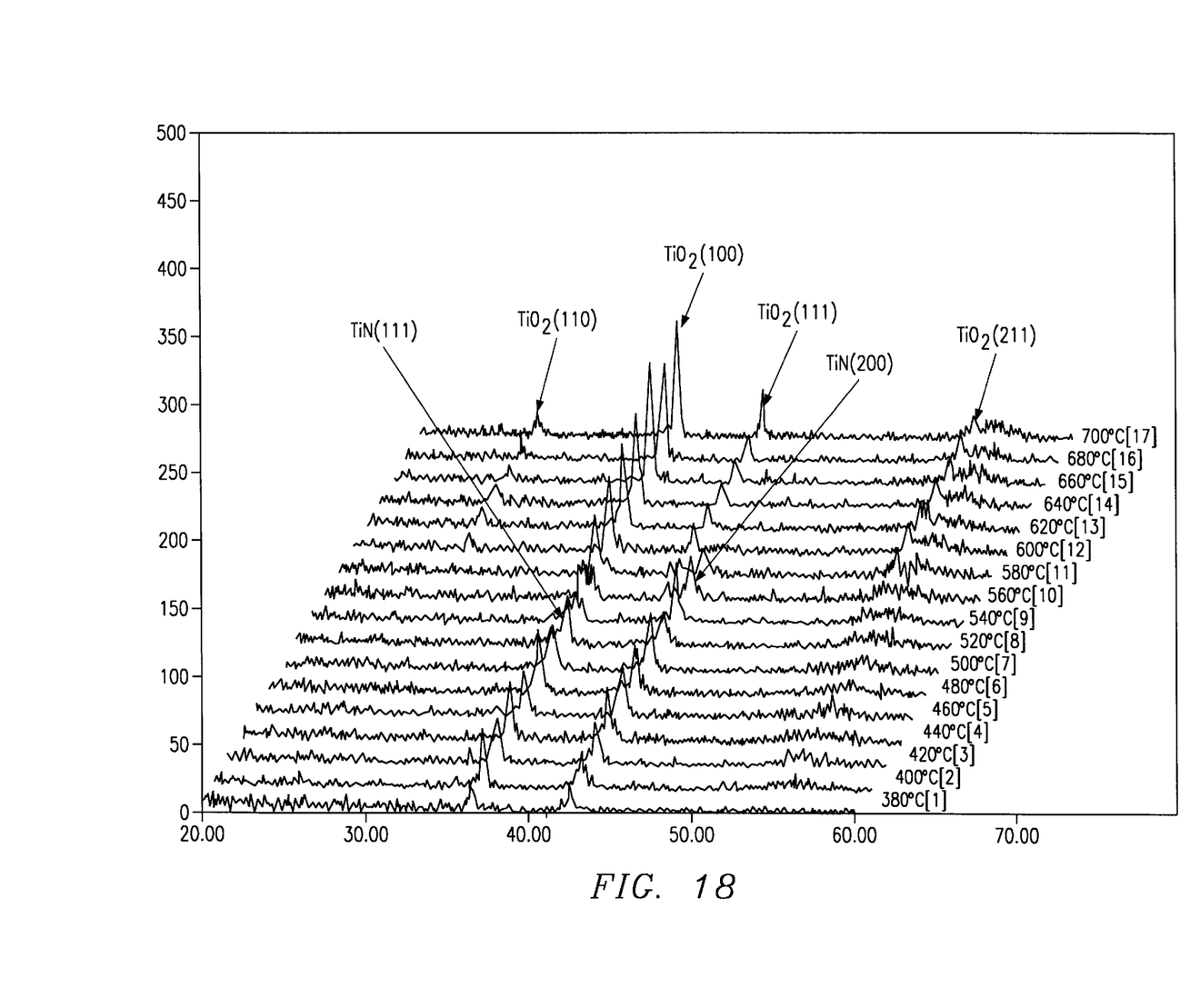
FIG. 18 is an X-ray diffraction spectrum diagram showing a temperature dependency of the oxidation of TiN on a Pt/TiN/Si structure.

FIG. 18 shows a result in which the oxidation start temperature of TiN (barrier metal: a film thickness of 1000 Å) in the lamination structure composed of Pt/TiN/Si is investigated by an X-ray diffraction method. According to the figure, a diffraction peak of TiO$_2$ showing the oxidation start of TiN starts to be seen at near 600° C. From the result, in case TiN is used as a barrier metal, the postannealing temperature is limited to 600° C. or lower.

The purpose of the present invention is to provide a method for manufacturing a metal oxide barrier such as BST, which can effectively suppress the oxidation of an undercoat metal such as a barrier metal while reducing the heat treatment temperature such as the postannealing temperature and a method for manufacturing a semiconductor memory device having the metal oxide capacitor.

SUMMARY OF THE INVENTION

These inventors reviewed the oxygen pressure in the postannealing instead of setting the temperature of the above-mentioned postannealing high, and as a result, it was discovered that the above-mentioned purpose could be sufficiently realized by setting the oxygen pressure to be higher than 1 atm, which was the conventional oxygen pressure (hereinafter, called a high-pressure oxygen postannealing). Then, the present invention was completed.

In other words, the present invention provides a method for manufacturing a metal oxide capacitor, which is characterized by the fact that in manufacturing a metal oxide capacitor in which a metal oxide film and a second electrode are sequentially laminated on a first electrode, the above-mentioned metal oxide film is formed and then heat treated (high-pressure oxygen postannealing) in an atmosphere with an oxygen pressure higher than 1 atm (in particular, 2–100 atm), and a method for manufacturing a semiconductor memory device, which manufactures the metal oxide capacitor.

The high-pressure oxygen postannealing by the method for manufacturing a metal oxide capacitor and the method for manufacturing a semiconductor device (hereinafter, sometimes called the method of the present invention) is very effective for the reduction of the postannealing temperature and is very effective for avoiding the oxidation caused during the postannealing of TiN and TaN used as a conventional barrier metal.

The effects of the method of the present invention are considered by the following oxidation reaction of TiN as an example. Here, since oxygen is provided by being diffused into the upper Pt electrode and BST, it is considered as an atomic state. Therefore, the oxidation reaction of TiN is expressed by the following formula.

In this case, the reaction velocity of the oxidation is proportional to the square of the partial oxygen pressure. On the other hand, the reaction velocity depends exponentially on the temperature. For this reason, it is favorable to set the oxygen pressure high at lower temperature (that is, by a high-pressure oxygen annealing) rather than to set the temperature high during the postannealing, since the oxidation rate of the barrier metal is suppressed.

According to the method of the present invention, since the oxidation of the barrier metal can be suppressed by the high-pressure oxygen annealing rather than by setting the postannealing temperature high, the oxidation of the barrier metal can be controlled to be more difficult while setting the temperature (preferably 550° C. or less, more preferably 350– 500° C.), at which the oxidation of the barrier metal is difficult to be generated, by lowering the postannealing temperature.

In the method of the present invention, it is preferable to carry out the postannealing at an oxygen pressure of 2–100 atm. If the oxygen pressure is less than 2 atm, the postannealing of the above-mentioned metal oxide film is not sufficient, even in a pressurized state. Also, if the oxygen pressure is more than 100 atm, the annealing is sufficient due to the high pressure; however, it is more dangerous for a work environment. Furthermore, it is preferable to carry out the postannealing at an oxygen pressure of 2–10 atm.

The applicable oxygen atmosphere in the method of the present invention may be an atmosphere of oxygen alone or a mixture of oxygen and an inert gas such as $N_2$ and Ar. In this case, the oxygen pressure is a gas pressure of the oxygen atmosphere itself for the oxygen alone and is a partial oxygen pressure for a mixed gas.

Also, as the postannealing timing, the above-mentioned first electrode is formed on the barrier metal, and the above-mentioned metal oxide film is formed in an oxygen atmosphere on the first electrode. Then, the above-mentioned second electrode is formed on the metal oxide film, and the above-mentioned heat treatment can be carried out. Or, the above-mentioned first electrode is formed on the barrier metal, and the above-mentioned metal oxide film is formed in an oxygen atmosphere on the first electrode. Then, the above-mentioned heat treatment can be carried out.

Also, as the above-mentioned barrier metal, a metal oxide such as TiN and TaN is used, and as the above-mentioned first electrode and the above-mentioned second electrode, a noble metal such as Pt, Ir, and Ru is used. Also, as the above-mentioned metal oxide film, (Ba, Sr)$TiO_3$, Pb(Zr, Ti)$O_3$, or $Ta_2O_5$ can be used. The metal oxide film can be formed by the well-known CVD method, sputtering, or sol-gel method.

REFERENCE NUMERALS AND SYMBOLS AS SHOWN IN THE DRAWINGS 3 represents source region, 4 a drain region, 6 a word line, 7, 47 an insulating layers, 8 a polysilicon plug, 24 a bit line, 35 a side wall, 37 an upper electrode, 38 a lower electrode, 39 a barrier metal, 40 a high-dielectric film, Cap, CAP a metal oxide thin-film (high-dielectric) capacitor, M-Cel a memory cell.

DESCRIPTION OF EMBODIMENTS

Next, the embodiments,, in which the present invention is applied to a metal oxide thin-film capacitor and a semiconductor memory having the capacitor, is explained using figures.

Figure 2:
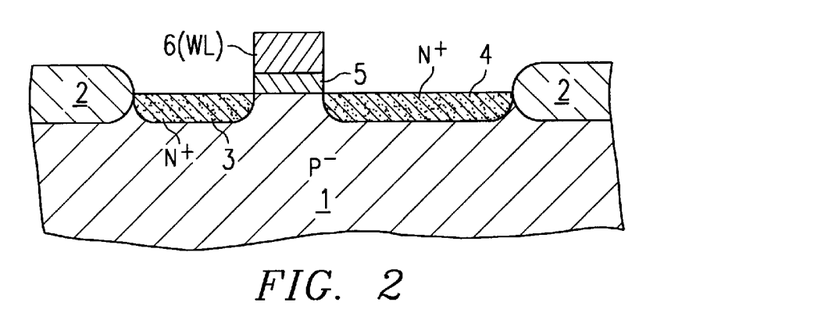
FIG. 2 is an outlined cross section at one stage in a process for manufacturing a memory cell having the same capacitor.

According to this embodiment, first, as shown in FIG. 2, a field oxide film 2 is formed on a P⁻ silicon substrate (wafer) 1 by a selective oxidation method; and a gate oxide film 5 by a thermal oxide method and a polysilicon word line 6 (WL) by a chemical vapor deposition method are respectively formed. After patterning them, a N⁺ drain region 3 and a source region 4 are respectively formed by thermal diffusion of an N-type impurity such as As.

Figure 3:
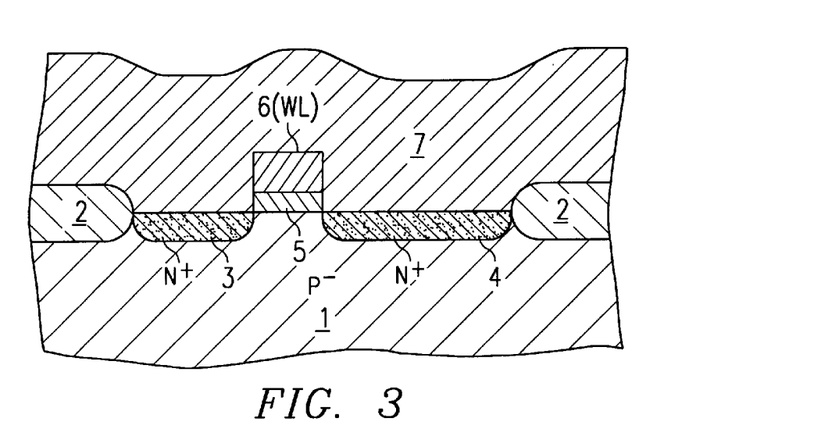
FIG. 3 is an outlined cross section at another stage in a process for manufacturing a memory cell having the same capacitor.
Figure 4:
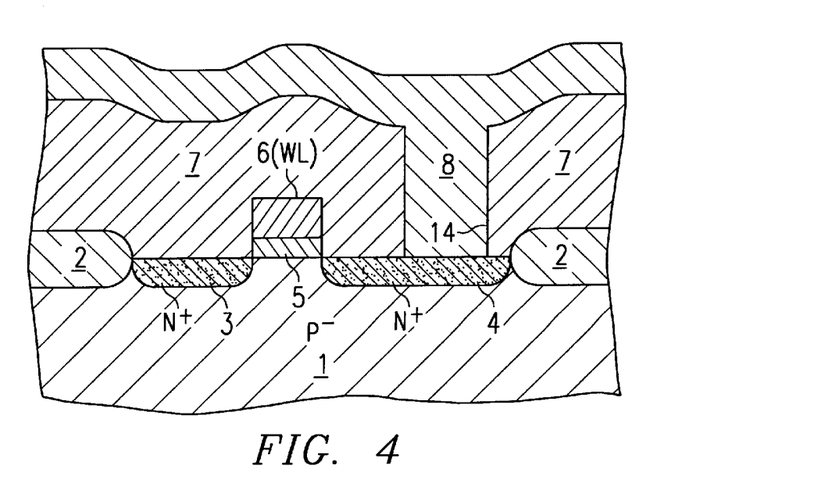
FIG. 4 is an outlined cross section at another stage in a process for manufacturing a memory cell having the same capacitor.

Next, as shown in FIG. 3, a $SiO_2$ insulating layer 7 is deposited on the entire surface by the chemical vapor deposition method, and the insulating layer 7 is etched using a photoresist mask (not shown in the figure). As shown in FIG. 4, a contact hole 14 is formed in a prescribed shape on the source region 4.

Next, a polysilicon layer 8 is deposited by chemical vapor deposition so that it contacts the source region 4 in the contact hole 14.

Figure 5:
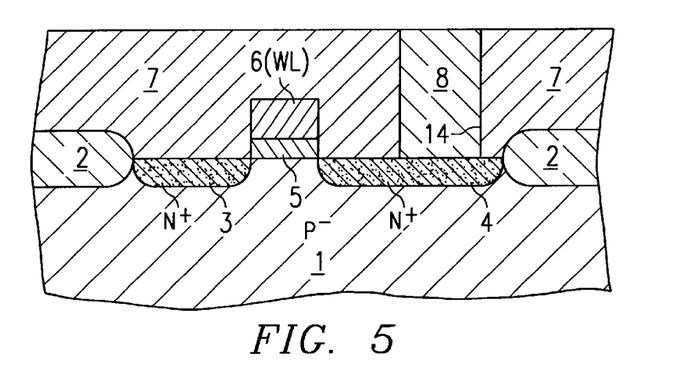
FIG. 5 is an outlined cross section at another stage in a process for manufacturing a memory cell having the same capacitor.

Next, as shown in FIG. 5, the polysilicon layer 8 as a storage node and the $SiO_2$ layer 7 are etched by a chemical mechanical polishing (CMP: Chemical Mechanical Polishing/Planarization) or an etch back due to plasma etching, so that the surface is flattened.

If the planarization is not carried out, that is, if the upper layer is laminated with a level difference, the coating characteristic of the upper layer will be deteriorated, so that leakage current and peeling-off of the film are generated.

Figure 6:
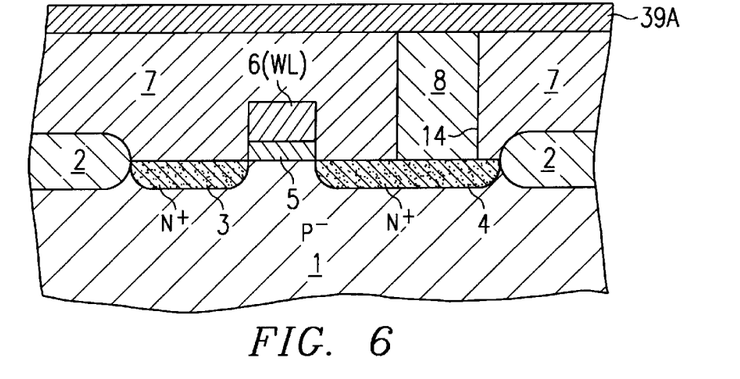
FIG. 6 is an outlined cross section at another stage in a process for manufacturing a memory cell having the same capacitor.
Figure 7:
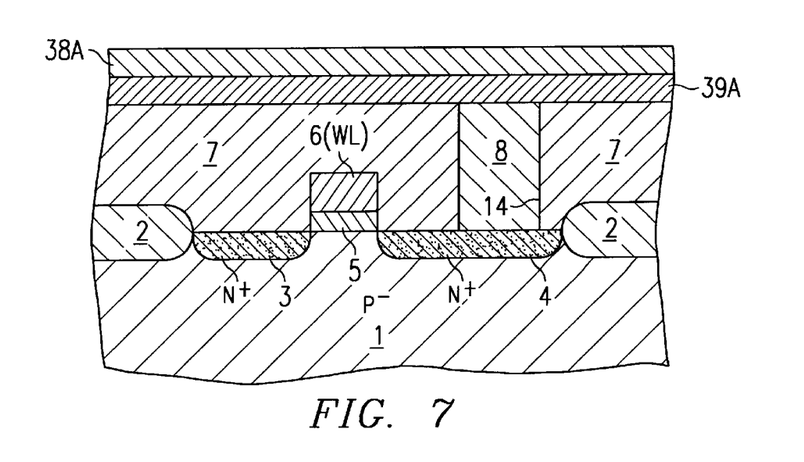
FIG. 7 is an outlined cross section at another stage in a process for manufacturing a memory cell having the same capacitor.

Next, a material 39A for a barrier metal layer composed of a TiN layer is sputtered or vapor-deposited as shown in FIG. 6 on the flattened surface, and a lower electrode material layer 38A composed of Pt is sputtered or vapor-deposited as shown in FIG. 7. Here, the thickness of the material 39A for a barrier metal layer is set to 200–2000 Å, which is sufficient for generating the function of a barrier metal.

Figure 8:
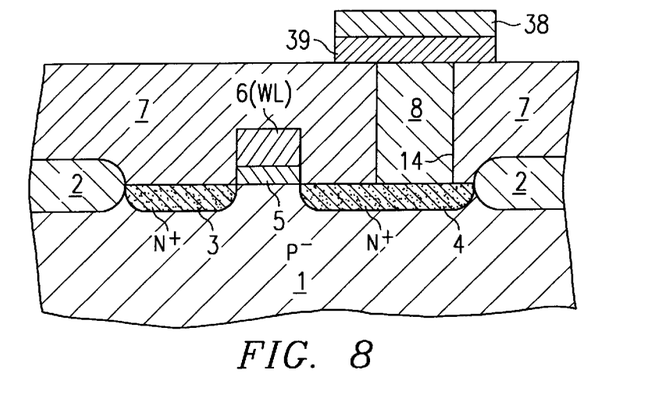
FIG. 8 is an outlined cross section at another stage in a process for manufacturing a memory cell having the same capacitor.

Next, as shown in FIG. 8, using the photoresist mask (not shown in the figure), the lower electrode 38 and the barrier metal layer 39 are etched in almost the same pattern.

Figure 9:
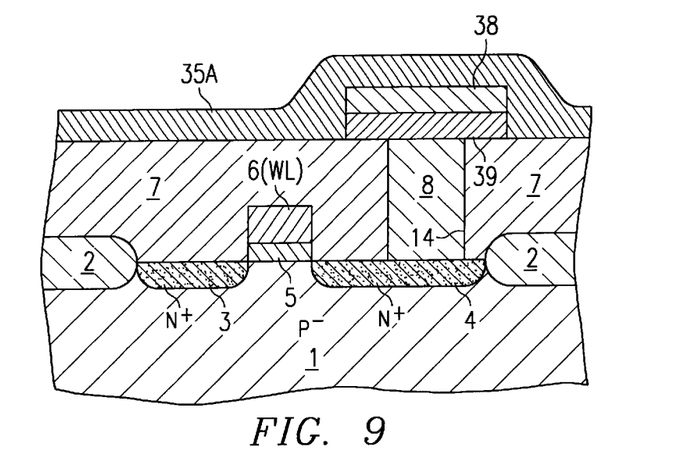
FIG. 9 is an outlined cross section at another stage in a process for manufacturing a memory cell having the same capacitor.
Figure 10:
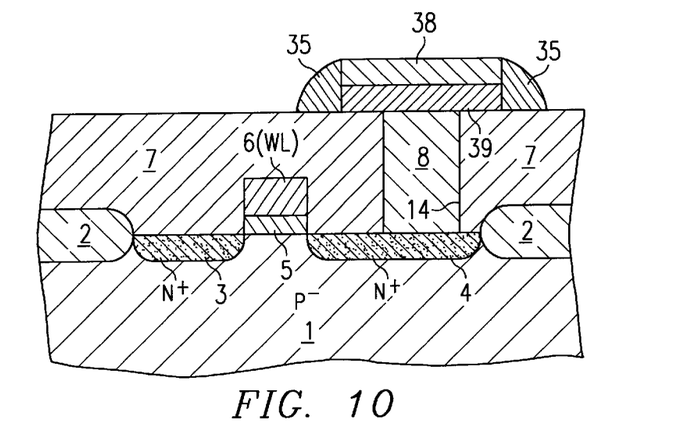
FIG. 10 is an outlined cross section at another stage in a process for manufacturing a memory cell having the same capacitor.

Next, as shown in FIG. 9, a $Sio_2$ [layer] 35A for forming a spacer (side wall for securing the insulation) is formed by chemical vapor deposition, and a $SiO_2$ spacer 35 with a prescribed shape is formed as a side wall as shown in FIG. 10 by the etch back due to an anisotropic plasma etching.

Figure 11:
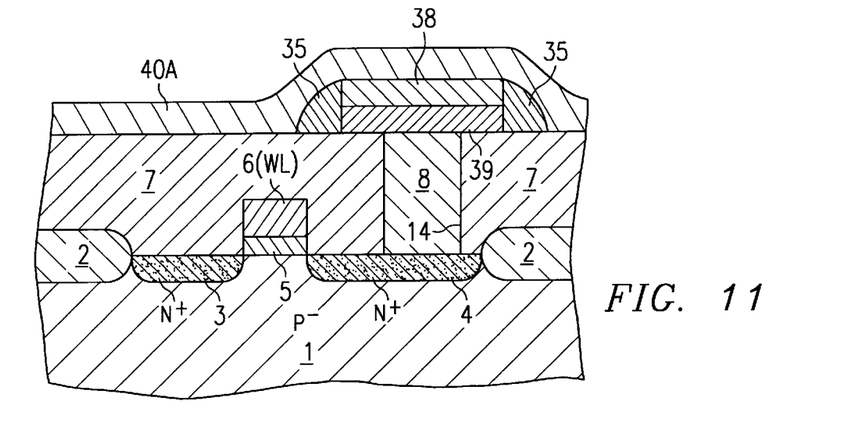
FIG. 11 is an outlined cross section at another stage in a process for manufacturing a memory cell having the same capacitor.
Figure 12:
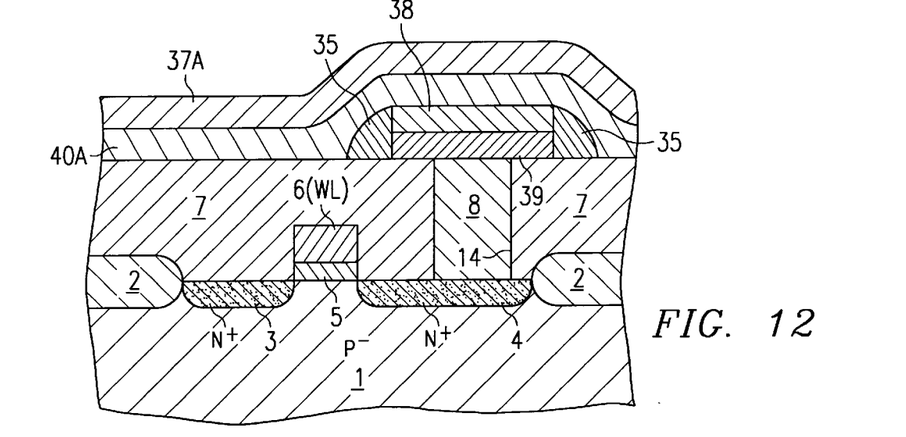
FIG. 12 is an outlined cross section at another stage in a process for manufacturing a memory cell having the same capacitor.

Next, as shown in FIG. 11, a high-dielectric material 40A composed of a BST (Ba, Sr) $TiO_3$ film is formed by a sputtering method or CVD method, and as shown in FIG. 12, an upper electrode material layer 37A composed of Pt or Ir is sputtered or vapor-deposited on it.

Figure 13:
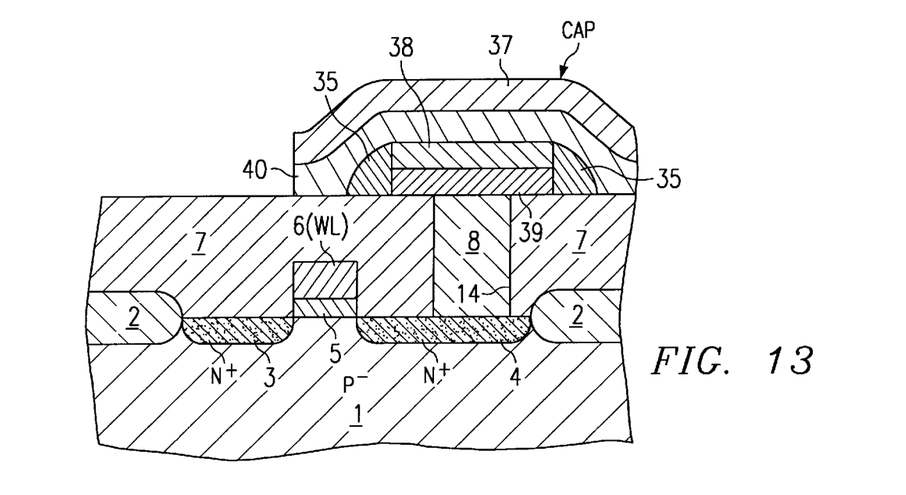
FIG. 13 is an outlined cross section at another stage in a process for manufacturing a memory cell having the same capacitor.

Next, as shown in FIG. 13, the upper electrode 37 and the high-dielectric film 40 are formed in a prescribed pattern by patterning through etching using the photoresist mask (not shown in the figure), so that a BST high-dielectric thin-film capacitor CAP is manufactured.

Next, a high-pressure oxygen postannealing is applied at 550° C. or lower (for example, 500° C.) for 10–240 min (for example, 30 min) to the capacitor CAP in an atmosphere including a high-pressure oxygen [atmosphere] of 2–10 atm (for example, 4 atm).

Figure 14:
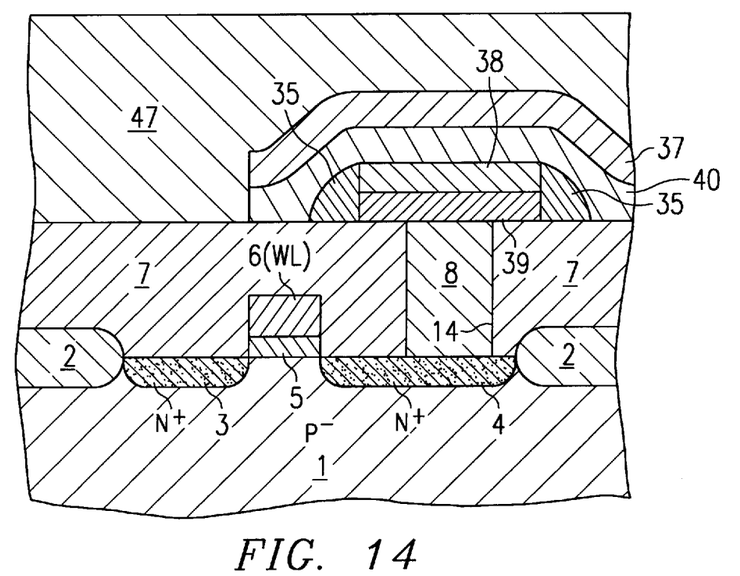
FIG. 14 is an outlined cross section at another stage in a process for manufacturing a memory cell having the same capacitor.
Figure 15:
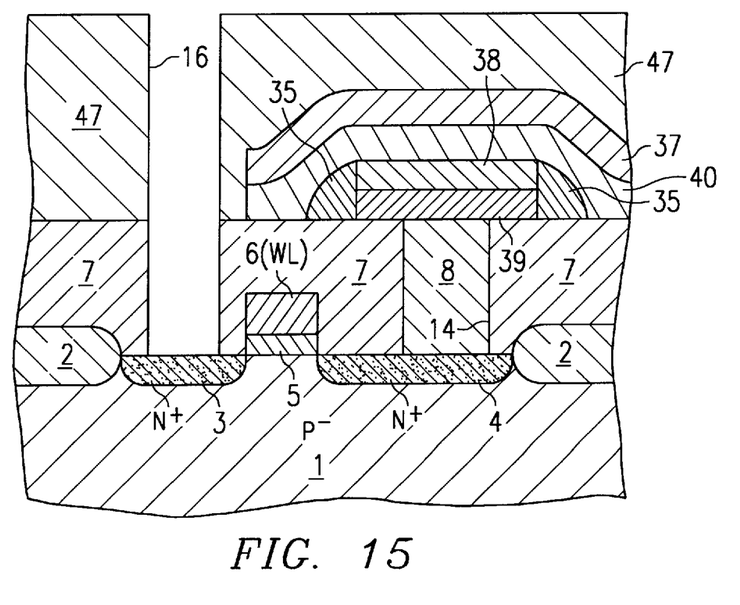
FIG. 15 is an outlined cross section at another stage in a process for manufacturing a memory cell having the same capacitor.

Next, as shown in FIG. 14, the insulating layer 47 such as $SiO_2$ is deposited by chemical vapor deposition, and as shown in FIG. 15, a contact hole 16 is formed in a prescribed pattern by plasma etching. Then, a bit line 24 (BL) is connected in the drain region 3 via the contact hole 16, and as shown in FIG. 16, similarly, a CUB-type high-dielectric memory cell, in which a high-dielectric capacitor CAP is assembled, is manufactured.

Here, a detailed test result about the above-mentioned high-pressure oxygen postannealing is explained.

Figure 1A:
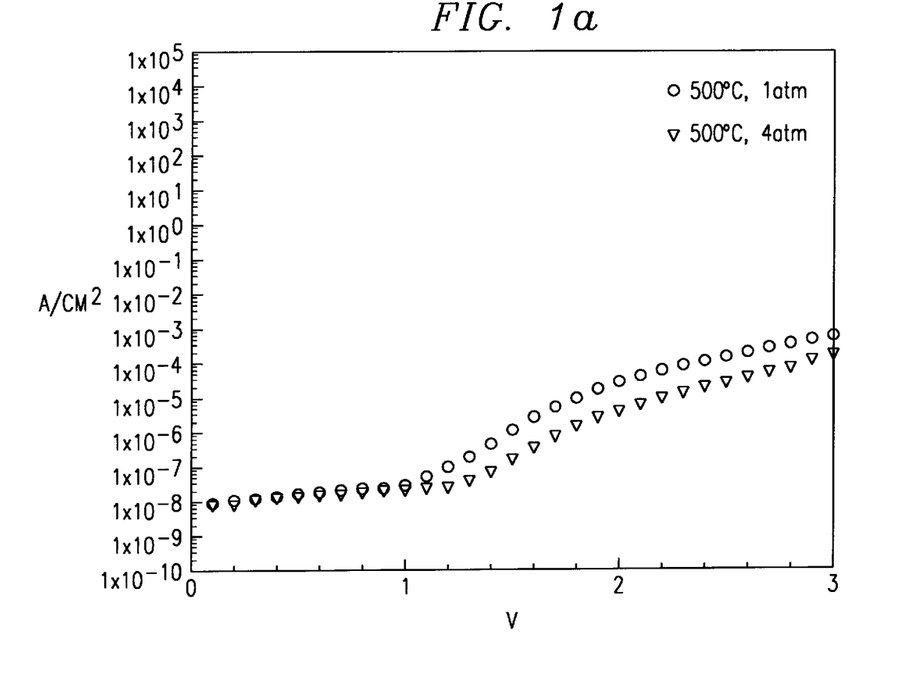
FIGS. 1a–1b is a characteristic diagram showing a comparison of the current-voltage characteristic after applying a postannealing in an atmosphere of different oxygen pressures to a capacitor with a Pt/BST/Pt structure in the embodiment of the present invention.
Figure 1B:
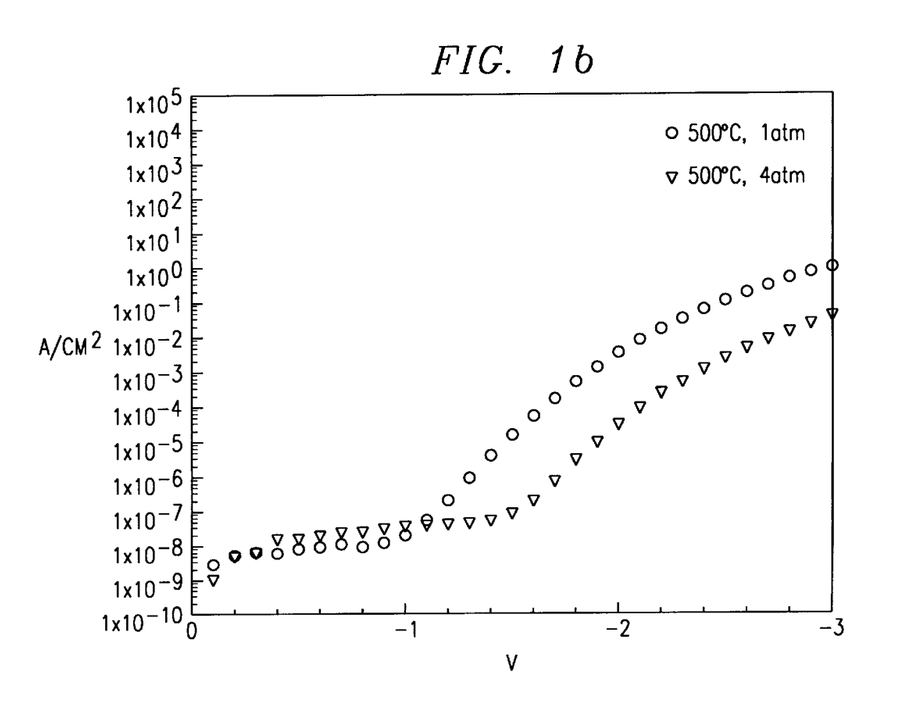

FIG. 1 shows a current-voltage characteristic after applying postannealing at 500° C. for 30 min to the above-mentioned capacitor CAP with a Pt/BST/Pt structure with a film thickness of 25 nm in an oxygen atmosphere of 1–4 atm. FIG. 1(a) shows a leakage current characteristic when a positive bias is applied to the above-mentioned Pt electrode, and FIG. 1(b) shows a leakage current characteristic when a negative bias is applied.

From the results, through the high-pressure oxygen postannealing in an oxygen atmosphere of 4 atm, it is apparent that the leakage current is reduced by one digit at a time of the positive bias and two digits at a time of the negative bias and that more improved characteristics are obtained.

Also, in FIG. 1, the results due to the postannealing of 1 atm are different from those shown in FIG. 17. The reason for this is considered that when the lower Pt electrode is formed, the film formation conditions and the thermal hysteresis are different. For example, the substrate temperature is lowered by 50° C. (the grain size of Pt is small) in the former. From this fact, if the film-formation conditions of the lower Pt electrode are controlled, for example, if the substrate temperature is set high, the leakage current can be reduced by the extension of the Pt grain size.

Also, since the high-pressure oxygen postannealing is carried out at 550° C. or lower (for example, 500° C.), the oxidation of the barrier metal (TiN, etc.) can be effectively suppressed.

So far, the Embodiment of the present invention has been explained; however, the above-mentioned embodiment can be modified based on the technical concept of the present invention.

For example, in the above-mentioned embodiment, the high-pressure oxygen postannealing after the formation of the capacitor (that is, after the formation of the upper Pt electrode) has been mentioned; however, similar effects are also obtained by a similar high-pressure oxygen postannealing prior to the formation of the upper electrode after forming the BST.

Also, as a material of the dielectric film, in addition to the above-mentioned BST, Pb(Zr, Ti) $0_3$ (so-called PZT), $Ta_2O_5$, etc., can also be used, and the film-forming method can also be selected from CVD method, sputtering method, sol-gel method, etc. Also, shape, size, etc., of the dielectric film may also be modified.

Also, as the electrode, in addition to Pt, a noble metal such as Ir and Ru can be used, and as the barrier metal, TaN, TaSiN, and TiAlN can also be used. Also, the structure is not limited to the above-mentioned capacitor structure as long as it is an upper electrode/dielectric film/lower electrode/undercoat electroconductive film (barrier metal, etc.).

Also, as the structure of the memory cell, in addition to the CUB type, a COB (Cell over Bitline) type can also be adopted.

As mentioned above, in the present invention, in manufacturing a metal oxide capacitor in which a metal oxide film and a second electrode are sequentially laminated on a first electrode, the above-mentioned metal oxide film is formed and then heat treated in an atmosphere with an oxygen pressure higher than 1 atm. Thus, the oxidation of the metal under the above-mentioned first electrode can be suppressed, compared with the case where the heat treatment temperature is raised, so that the oxidation of the undercoat metal can be controlled to be more difficult while setting the temperature, at which the oxidation of the undercoat metal is difficult to be generated, by lowering the heat treatment temperature.

What is claimed is:

1. A method for manufacturing a metal oxide capacitor comprising in manufacturing a metal oxide capacitor in which a metal oxide film and a second electrode are sequentially laminated on a first electrode, the above-mentioned metal oxide film is formed and then heat-treated in an atmosphere with an oxygen pressure higher than 1 atm.

2. The method of claim 1, wherein a postannealing as the above-mentioned heat treatment is carried out in an atmosphere with an oxygen pressure of 2–100 atm.

3. The method of claim 1, wherein the above-mentioned heat treatment is carried out at 550° C. or lower.

4. The method of claim 1, wherein the the above-mentioned first electrode on a barrier metal, forms the above-mentioned metal oxide film in an oxygen atmosphere on the first electrode, forms the above-mentioned second electrode on the metal oxide film, and carries out the above-mentioned heat treatment.

5. A method of manufacturing a microelectronic capacitor comprising:

a. forming a first capacitor electrode over a semiconductor substrate;

b. applying a metal oxide film to the first electrode;

c. forming a second electrode over the metal oxide film to form a capacitor; and d. heat treating the metal oxide film subsequent to forming the second electrode in an atmosphere of oxygen with a pressure higher than 1 atm and at a temperature less than 600° C.

6. The method of claim 5 wherein the heat treating is performed with a pressure of 2–100 atm.

7. The method of claim 5 wherein the heat treating is performed below about 550° C.

8. The method of claim 5 wherein the first electrode is formed on a barrier metal comprising a metal nitride, the second electrode is a noble metal and the metal oxide film comprises materials chosen from the following: (Ba, Sr)TiO$_3$, Pb(Zr, Ti)O$_3$, and Ta$_2$O$_5$.

9. A method of manufacturing a microelectronic capacitor for a semiconductor memory element comprising:

a. forming a first capacitor electrode over a semiconductor substrate;

b. applying a metal oxide film to the first electrode;

c. forming a second electrode over the metal oxide film to form a capacitor; and d. heat treating the metal oxide film subsequent to forming the second electrode in an atmosphere of oxygen with a pressure higher than 1 atm and at a temperature below about 550° C.

10. The method of claim 9 wherein the heat treating is performed with a pressure of about 2–10 atm.

11. The method of claim 10 wherein the first electrode is formed on a barrier metal comprising a metal nitride.

12. The method of claim 11 wherein and the metal oxide film comprises materials chosen from the following: (Ba, Sr)TiO$_3$, Pb(Zr, Ti)O$_3$, and Ta$_2$O$_5$.

13. The method of claim 9 wherein and the metal oxide film comprises materials chosen from the following: (Ba, Sr)TiO$_3$, Pb(Zr, Ti)O$_3$, and Ta$_2$O$_5$.

14. The method of claim 9 wherein the heat treating is performed at a temperature about 350° C.

* * * * *